United States Patent
Puget et al.

(10) Patent No.: US 8,067,060 B2
(45) Date of Patent: Nov. 29, 2011

(54) METHOD FOR DEPOSITING A POLYMER LAYER ON A SURFACE OF A SUPPORT COMPRISING AT LEAST A RECESSED ZONE

(75) Inventors: Christiane Puget, Saint-Egreve (FR); David Henry, Gieres (FR)

(73) Assignee: Commissariat a l'Energie Atomique, Paris (FR)

( * ) Notice: Subject to any disclaimer, the term of this patent is extended or adjusted under 35 U.S.C. 154(b) by 961 days.

(21) Appl. No.: 12/007,673

(22) Filed: Jan. 14, 2008

(65) Prior Publication Data

US 2008/0175996 A1 Jul. 24, 2008

(30) Foreign Application Priority Data

Jan. 23, 2007 (FR) ..................... 07 00450

(51) Int. Cl.
*B05D 3/12* (2006.01)
*B05D 1/40* (2006.01)
*B05D 1/36* (2006.01)

(52) U.S. Cl. ........ 427/240; 427/355; 427/359; 427/425; 438/758

(58) Field of Classification Search ................. 427/240, 427/355, 359, 425; 438/758
See application file for complete search history.

(56) References Cited

U.S. PATENT DOCUMENTS

| | | | |
|---|---|---|---|
| 5,260,174 A | 11/1993 | Nakazawa et al. | |
| 5,849,435 A | 12/1998 | Akram et al. | |
| 5,925,410 A * | 7/1999 | Akram et al. | 427/240 |
| 7,744,947 B2 * | 6/2010 | Lee et al. | 427/58 |
| 2006/0118778 A1* | 6/2006 | Clemens et al. | 257/40 |

FOREIGN PATENT DOCUMENTS

JP A 2005-019560 1/2005

OTHER PUBLICATIONS

Fischer, K. et al., "Spray Coating—a Solution for Resist Film Deposition Across Severe Topography," IEEE/SEMI Int'l Electronics Manufacturing Technology Symposium, SUSS MicroTec AG, XP010715512, p. 338-342 (Jul. 2004).

Pham, Nga P. et al., "Direct Spray Coating of Photoresist—a New Method for Patterning 3-D Structures," Eurosensors XVI, The 16$^{th}$ European Conference on Solid-State Transducers, p. 182-185 (Sep. 15-18, 2002).

* cited by examiner

*Primary Examiner* — Kirsten Jolley
(74) *Attorney, Agent, or Firm* — Oliff & Berridge, PLC

(57) ABSTRACT

A polymer layer is deposited on a surface of a support, said surface comprising a flat main part and at least one recessed zone with respect to the flat main part. The polymer layer is achieved by at least the following successive steps:
 deposition of a predetermined quantity of a liquid mixture comprising at least a polymer or at least a precursor of said polymer on the flat main part of the surface of the support,
 introducing at least a part of the liquid mixture into the recessed zone by moving a cylinder placed on the flat main part of the surface,
 deposition of an additional quantity of liquid mixture on the flat main part of the surface,
 and rotation of the support along an axis perpendicular to the plane of the surface.

9 Claims, 3 Drawing Sheets

METHOD FOR DEPOSITING A POLYMER LAYER ON A SURFACE OF A SUPPORT COMPRISING AT LEAST A RECESSED ZONE

BACKGROUND OF THE INVENTION

The invention relates to a method for depositing a polymer-based layer on a surface of a support, said surface comprising a flat main part and at least a zone that is recessed with respect to the flat main part.

STATE OF THE ART

Fabrication of electronic devices such as microelectronic components or microsystems more often than not requires a lithography step designed to transfer patterns onto a substrate. The lithography step consists in a general manner in depositing a layer of photoresist on a substrate. The photoresist layer is then exposed through a patterned mask, ie. a mask comprising patterns. The photoresist is finally developed so as to obtain patterns in said photoresist corresponding either to the mask patterns (the case of a positive photoresist) or to the complementary parts of the mask patterns (the case of a negative photoresist). An lithography step can then be performed through the patterned photoresist to transfer the patterns into the substrate.

The lithography step and in particular the phase corresponding to deposition of the photoresist layer, also called photoresist coating phase, are critical in terms of resolution and quality.

The technique the most commonly used for depositing the photoresist layer on a substrate is spin coating. This technique consists in forming a uniform thin film on a substrate by rotating said substrate. A liquid is thus deposited on the substrate surface. It is then spread into the form of a layer by the action of a centrifugal force created by rotation of the substrate. Once the solvent has evaporated, this forms a thin film of photoresist. Although it is very widely used, this technique is not suitable for all types of substrate. The spin coating technique does in fact generate defects for substrates presenting a surface that is not flat.

A deposition technique has been proposed for depositing a photoresist on a substrate presenting a non-flat surface. This technique has for example been reported by Nga P. Pham et al. in the article "Direct spray coating of photoresist—a new method for patterning 3-D structures" (Eurosensors XVI The 16$^{th}$ European Conference on Solid-State Transducers, Sep. 15-18, 2002, Prague, Czech Republic). It consists in spraying a compound designed to form the layer and diluted in a solvent on a rotated substrate by means of an ultrasonic spraying nozzle. This enables the compound to be deposited on the whole of the substrate, in particular by moving the substrate with respect to the spraying nozzle. This technique is known under the name of spray coating.

This technique does however remain difficult to implement. Moreover, the thickness of the deposited layers is limited as the compound is diluted in a solvent and presents a low viscosity. Thus, with the spray coating technique, the deposited layers cannot have a thickness of more than 10 µm for recessed zones with a depth larger than 250 µm. Moreover, as represented in FIG. 1, this technique is not suitable for depositions on a surface of a substrate 1 comprising a recessed zone 1b, the side wall 1c of which zone forms a right angle with the flat main part 1a of said surface. At the level of the right angle also called step passage, the thickness of the deposited layer 2 is in fact greatly reduced compared with that deposited on flat main part 1a and with that deposited in the rest of recessed zone 1b. The spray coating technique may even generate an absence of deposited product at the level of said step passage, thus creating a discontinuity of deposited layer. Finally, this technique results in a large loss of product. Complete overlapping of the substrate by the compound does in fact require a large quantity of solution to be sprayed to obtain the quantity of deposited compound actually required. This results in increased cost.

OBJECT OF THE INVENTION

The object of the invention is to provide a deposition method remedying the shortcomings of the prior art.

More particularly the object of the invention is to provide a deposition method whereby a continuous polymer layer can be deposited on a surface of a support comprising a flat main part and at least a recessed zone in particular in the case where a side wall of the recessed zone forms a right angle with the flat main part of the support surface.

According to the invention, this object is achieved by the fact that the method comprises at least the following successive steps:
- deposition of a predetermined quantity of a liquid mixture comprising at least the polymer or at least a precursor of said polymer on the flat main part of the surface of the support,
- introducing at least a part of the liquid mixture into the recessed zone by moving a cylinder placed on the flat main part of the surface,
- deposition of an additional quantity of liquid mixture on the flat main part of the surface,
- and rotation of the support along an axis perpendicular to the plane of the surface.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Figure 1:
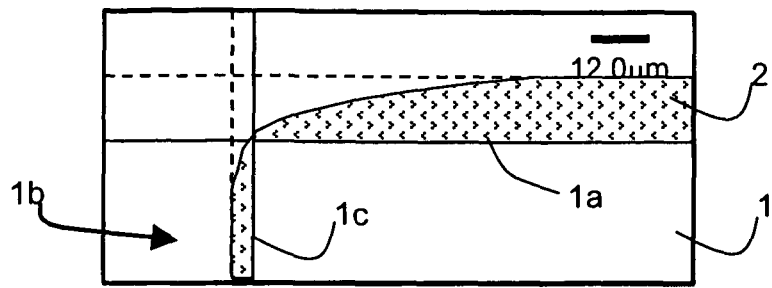
FIG. 1 represents, in cross-section, a support equipped with a recessed zone and covered by a layer deposited according to a method of the prior art.
Figure 2:
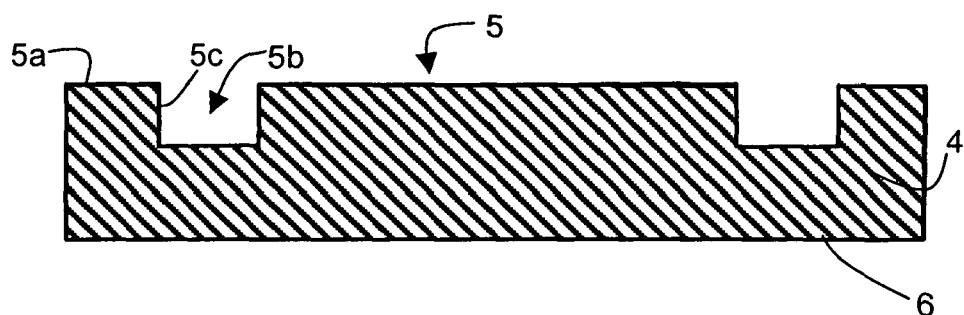
FIGS. 2 to 9 schematically represent different steps of a deposition method according to the invention, in cross-section.

As represented in FIGS. 2 to 9, a polymer layer 3 also called polymer-based layer is deposited on a support 4 according to a particular embodiment.

The polymer of layer 3 can be a thermoplastic or thermosetting polymer or an elastomer. Among thermoplastic polymers, the following can be cited: polyimide (PI), polyamide-imide (PAI), liquid crystal polymer (LCP), polysulfone (PSU), benzo-cyclo-butene (BCB), acrylic glues, ethylene acetate, polytetrafluoroethylene (PTFE), polyvinylidene fluoride (PVDF), and poly(ethylene terephthalate) also known under the abbreviation of PET. Among the thermosetting polymers, the following can be cited: epoxy resins, silicone, and polyester. Polymer layer 3 can furthermore be a positive or negative photoresist layer designed to be used in a lithography step.

Polymer layer 3 can also comprise components such as fillers to modify certain properties of the polymer such as its mechanical and/or electrical properties. For example, it can contain particles of silica so as to lower the coefficient of thermal expansion, also noted CTE, of the polymer and to bring it as close as possible to that of the material forming support 4 (for example made of silicon). This enables the interface stresses linked to the different expansions of the materials in presence to be reduced. According to another example, polymer layer 3 can be made conducting by introducing charged particles, for example copper or nickel particles, into the polymer. Such a polymer layer is for example achieved by fabrication techniques used in the field of anisotropic conducting films.

Support 4 is more particularly a substrate designed to be used in the microelectronics field, for example to form a microelectronic device or a microsystem. It is for example made from a semi-conducting material such as silicon. In FIGS. 2 to 9, it comprises opposite first and second surfaces 5 and 6, respectively not-flat and flat. First surface 5 comprises a flat main part 5a and zones 5b that are recessed with respect to said flat main part 5a. Recessed zones 5b, also called cavities, can be of any type of shape. In FIGS. 2 to 9, they are of rectangular cross-section and comprise a side wall 5c forming a right angle with flat main part 5a. The right angle is also called step passage.

Polymer layer 3 is formed on first surface 5 of support 2 by previously depositing a predetermined quantity of a liquid mixture 7 containing the compound to be deposited on flat main part 5a. Said compound is more particularly the polymer to be deposited or at least a precursor of said polymer, i.e. a monomer. In addition, the polymer or precursor of said polymer is preferably diluted in a solvent and a photocurable agent, such as diazo-naphto-quinone (DNQ), can also be added to the mixture. For example, the polymer or precursor of said polymer can be diluted in a solvent such as propylene glycol methyl ether acetate also called PGMEA. The dynamic viscosity of liquid mixture 7 is preferably comprised between about $10^{-2}$ Pa·s, (also noted $10^{-2}$ Pl or 10 centipoises noted cPo) and 1 Pa·s.

Figure 3:
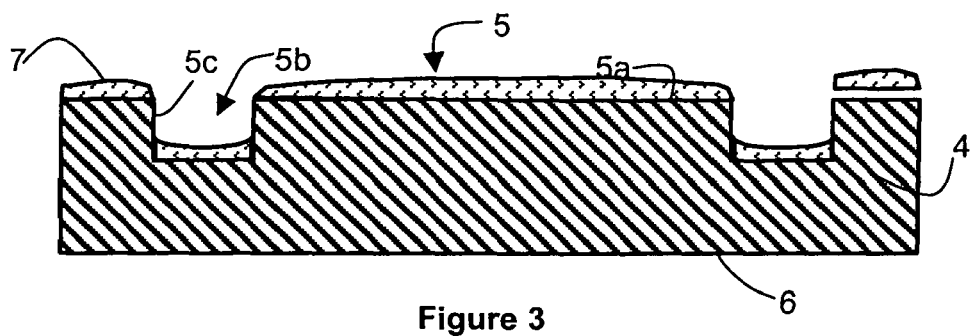

More particularly, as represented in FIG. 3, liquid mixture 7 is deposited on surface 5 of support 4. It covers flat main part 5a and the bottom of recessed zones 5b. It can for example be deposited by a conventional spin coating step.

Figure 4:
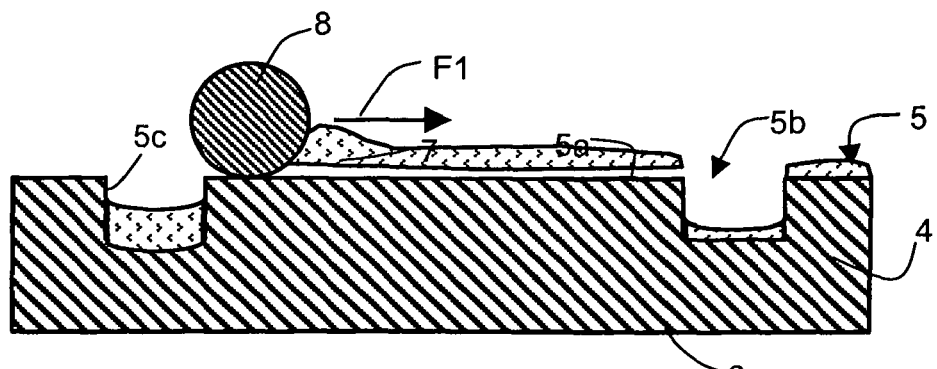

A cylinder or roller 8 is then placed on flat main part 5a of support 4. It is then moved along an axis parallel to the plane of flat main part 5a of support 4, while remaining in contact with said flat main part 5a. This movement of cylinder 8 enables liquid mixture 7 present on flat main part 5a to be moved to recessed zones 5b and to be introduced into said recessed zones 5b. In FIG. 4, the movement of cylinder 8 is represented by arrow F1.

Figure 5:
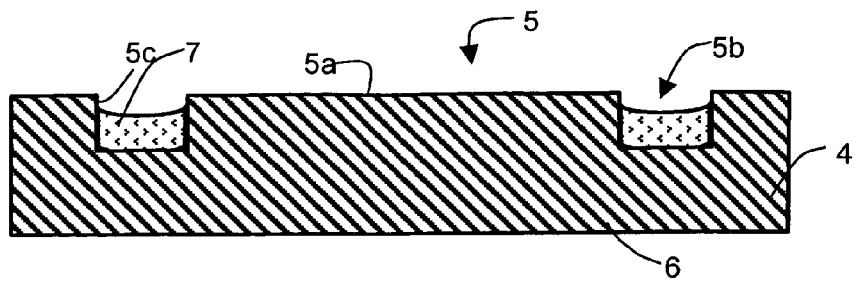

Once cylinder 8 has been moved and as represented in FIG. 5, recessed zones 5b are at least partially filled by liquid mixture 7. On the other hand, as indicated in FIG. 5, passage of cylinder 8 on flat main part 5a may prevent said flat main part 5a from being covered by liquid mixture 7. In other cases, flat main part 5a may be covered by a film of liquid mixture 7, but the thickness of said film does however remain small due to the passage of cylinder 8.

Figure 6:
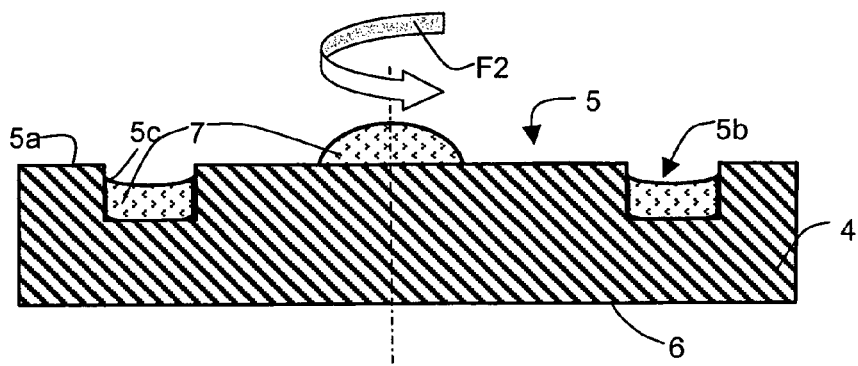
Figure 7:
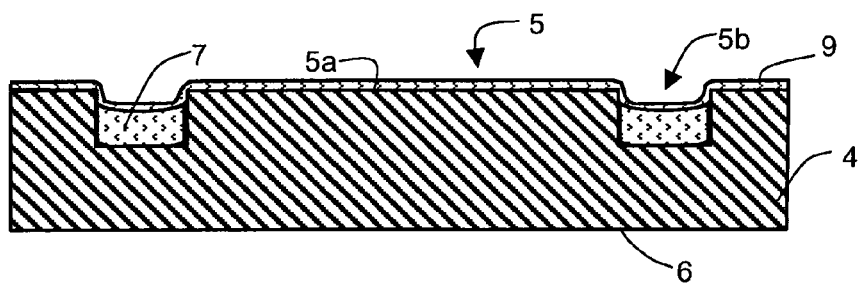

A spin coating step is then performed, after cylinder 8 has passed, to cover flat main part 5a of support 4 satisfactorily, in a polymer layer. As represented in FIG. 6, an additional quantity of liquid mixture 7 is therefore deposited on flat main part 5a of support 4. Support 4 is then rotated. Rotation of support 4 is represented by arrow F2 in FIG. 6. The speed of rotation of support 4 is determined according to the thickness required for the polymer layer.

Spin coating thus enables a film 9 of liquid mixture 7 to be formed on first surface 5 provided with recessed zones 5b, said zones already being at least partially filled with liquid mixture 7. The assembly formed by liquid mixture 7 at least partially filling recessed zones 5b and spin coated film 9 then forms a continuous layer deposited on the whole of first surface 5a and presenting a sufficient thickness at the level of the step passage.

Said continuous layer is then dried to form polymer layer 3. Thus, if liquid mixture 7 comprises a solvent, the latter is eliminated to obtain polymer layer 3. Elimination of the solvent can be performed by any type of known means, such as thermal treatment (annealing) or by drying in ambient air. Moreover, when liquid mixture 7 contains a polymer precursor, an additional polymerization step can be performed after the solvent elimination step.

Figure 8:
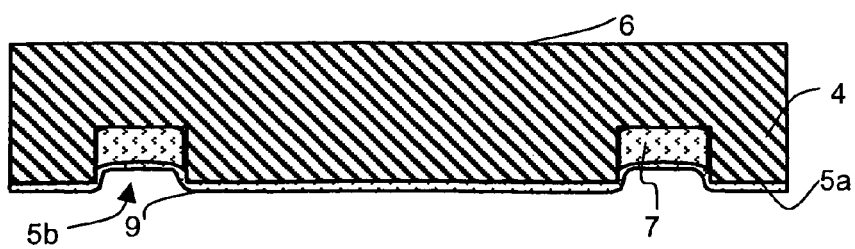

As illustrated in FIG. 8, according to a particular embodiment, the step whereby the polymer is obtained from liquid mixture 7 can advantageously be performed by directing first surface 5 of support 4 downwards. This improves the continuity of polymer layer 3, in particular at the level of the step passage.

Figure 9:
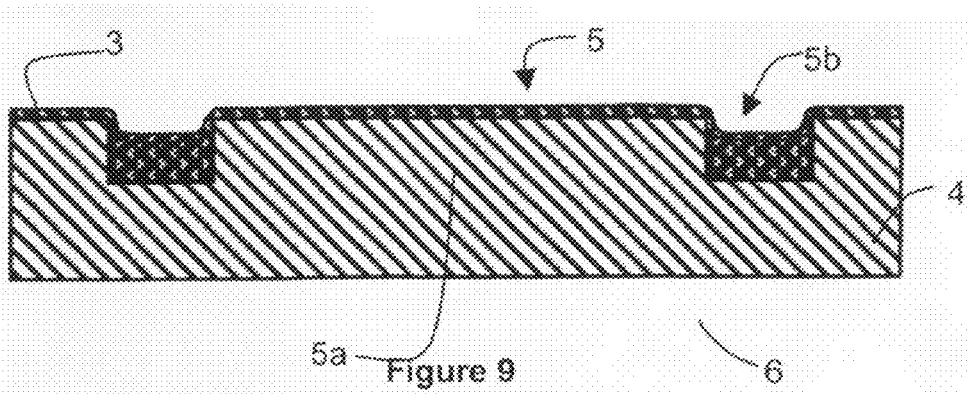

FIG. 9 represents polymer layer 3 deposited on first surface 5 of support 4 once liquid mixture 7 has dried, i.e. the solvent has been eliminated and/or the precursor polymerized or cross-linked.

For example, liquid mixture 7 is a solution marketed by JSR Corporation under the name of PFR IX 335. Once the continuous layer of liquid mixture 7 has been deposited, annealing can be performed at a temperature of 115° C. for 90 seconds, then said layer is exposed and a new annealing is performed at a temperature of 90° C. for 90 seconds to form a photoresist layer.

Figure 10:
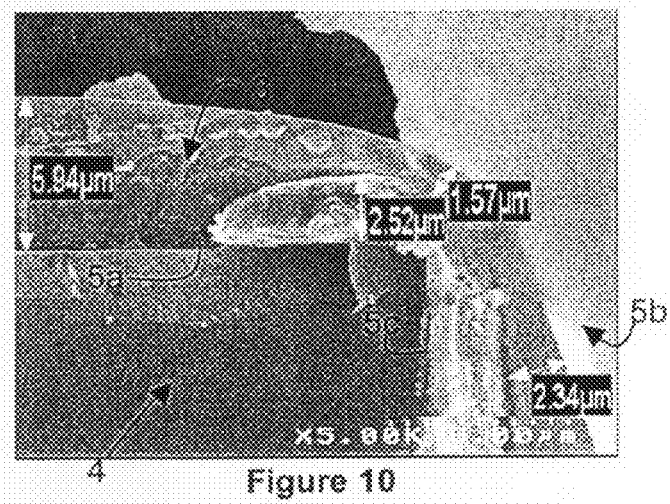
FIG. 10 represents a photo obtained by scanning electron microscopy of a polymer layer deposited by a method according to the invention on a support provided with a recessed zone.

The deposition method according to the invention is simple to implement. It enables depositions of viscous, possibly photosensitive, products to be made on substrates presenting a surface that is not flat with at least a recessed zone. More particularly, the non-flat surface is totally covered by the polymer layer, even if it presents a cavity the side wall of which forms a right angle with the flat part of the surface. For example, FIG. 10 represents a photo obtained by scanning electron microscopy of a support 4 comprising a non-flat surface having a cavity 5b and flat main part 5a. Said surface 5 is covered by a layer of BCB, implementing a method such as the one represented in FIGS. 2 to 9. Cavity 5b has a depth of 70 μm and a width of 80 μm and its side wall 5c forms a right angle with flat main part 5a. It can be observed in FIG. 9 that the BCB layer does not present any discontinuity over the whole of the non-flat surface, even at the level of the right angle. Thus, on flat main part 5a, the BCB layer presents a thickness of 5.94 μm and, at the level of the right angle, its total thickness is 4.09 μm. Moreover, in cavity 5b, the BCB layer is formed by two sub-layers respectively formed by application of cylinder 8 and by spin coating, whereas on the flat main part it is formed almost only by the sub-layer deposited by spin coating.

Figure 11:
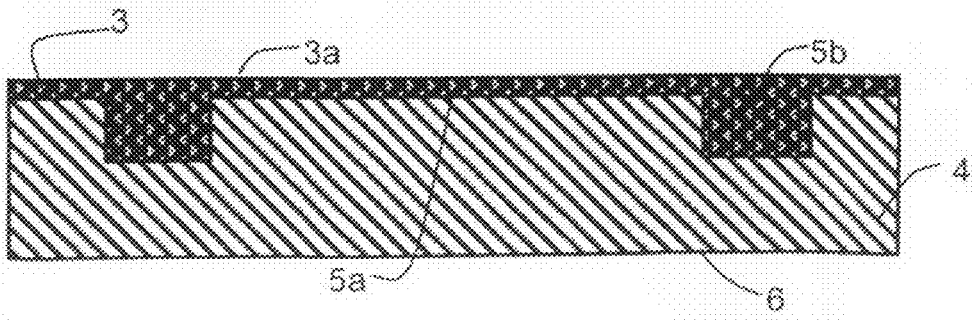
FIG. 11 schematically represents an alternative embodiment of a deposition method according to the invention, in cross-section.

Finally, in an alternative embodiment represented in FIG. 11, the recessed zones can be totally filled with liquid mixture so as to obtain a polymer layer 3 presenting a flat free surface 3a.

We claim:

1. A method for forming a continuous polymer layer on a non-flat surface of a support, said non-flat surface comprising a flat main part and at least one recessed zone with respect to the flat main part, the method comprising at least the following successive steps:

deposition of a predetermined quantity of a liquid mixture comprising at least a polymer or at least a precursor of said polymer on the flat main part of the non-flat surface, partially filling the at least one recessed zone with the liquid mixture by passing a cylinder or a roller on the flat main part of the non-flat surface in order to move the liquid mixture present on the flat main part to the at least one recessed zone and to prevent the flat main part from being covered by the liquid mixture, wherein the cylinder or roller remains in contact with the flat main part during passage of the cylinder or roller, deposition of an additional quantity of the liquid mixture on the flat main part of the non-flat surface, and rotation of the support along an axis perpendicular to the plane of the non-flat surface to form the continuous polymer layer.

2. The method according to claim 1, wherein the liquid mixture comprises a solvent in which the polymer or the polymer precursor is diluted.

3. The method according to claim 2, wherein the solvent is eliminated after the support has been rotated.

4. The method according to claim 3, wherein elimination of the solvent is achieved by performing an annealing step.

5. The method according to claim 3, wherein the non-flat surface of the support is directed downwards during elimination of the solvent.

6. The method according to claim 1, wherein the continuous polymer layer is a photosensitive polymer layer.

7. The method according to claim 1, wherein the liquid mixture presents a dynamic viscosity comprised between $10^{-2}$ Pl and 1 Pl.

8. The method according to claim 1, wherein the continuous polymer layer has a flat surface.

9. The method according to claim 1, wherein the at least one recessed zone presents a side wall forming a right angle with the flat main part.

\* \* \* \* \*